(12) United States Patent
Damodaran et al.

(10) Patent No.: US 8,732,416 B2
(45) Date of Patent: May 20, 2014

(54) REQUESTER BASED TRANSACTION STATUS REPORTING IN A SYSTEM WITH MULTI-LEVEL MEMORY

(75) Inventors: Raguram Damodaran, Plano, TX (US); Abhijeet Ashok Chachad, Plano, TX (US); Ramakrishnan Venkatasubramanian, Plano, TX (US); Dheera Balasubramanian, Richardson, TX (US); Naveen Bhoria, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 267 days.

(21) Appl. No.: 13/239,045

(22) Filed: Sep. 21, 2011

(65) Prior Publication Data

US 2012/0079102 A1    Mar. 29, 2012

Related U.S. Application Data

(60) Provisional application No. 61/387,283, filed on Sep. 28, 2010.

(51) Int. Cl.
*G06F 13/00* (2006.01)
*G06F 12/02* (2006.01)

(52) U.S. Cl.
CPC .................. *G06F 12/0246* (2013.01)

USPC .................................................... 711/156

(58) Field of Classification Search
None
See application file for complete search history.

(56) References Cited

U.S. PATENT DOCUMENTS

| 6,496,740 | B1* | 12/2002 | Robertson et al. ............... 700/20 |
| 2004/0088499 | A1* | 5/2004 | Woodward ..................... 711/148 |
| 2006/0015652 | A1* | 1/2006 | Day et al. ........................... 710/5 |
| 2008/0168191 | A1* | 7/2008 | Biran et al. ..................... 710/23 |
| 2011/0035529 | A1* | 2/2011 | Wang et al. ................... 710/317 |

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

* cited by examiner

*Primary Examiner* — Duc Doan
(74) *Attorney, Agent, or Firm* — Robert D. Marshall, Jr.; W. James Brady; Frederick J. Telecky, Jr.

(57) ABSTRACT

A system has memory resources accessible by a central processing unit (CPU). One or more transaction requests are initiated by the CPU for access to one or more of the memory resources. Initiation of transaction requests is ceased for a period of time. The memory resources are monitored to determine when all of the transaction requests initiated by the CPU have been completed. An idle signal accessible by the CPU is provided that is asserted when all of the transaction requests initiated by the CPU have been completed.

13 Claims, 9 Drawing Sheets

US 8,732,416 B2

REQUESTER BASED TRANSACTION STATUS REPORTING IN A SYSTEM WITH MULTI-LEVEL MEMORY

CLAIM OF PRIORITY UNDER 35 U.S.C. 119(e)

The present application claims priority to and incorporates by reference US Provisional Application No. 61/387,283, filed Sep. 28, 2010, entitled "Cache Controller Architecture."

FIELD OF THE INVENTION

This invention generally relates to management of memory access by multiple requesters, and in particular to synchronizing access and access ordering by the multiple requesters.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced process nodes. Many SoC designs pair a digital signal processor (DSP) with a reduced instruction set computing (RISC) processor to target specific applications. A more recent approach to increasing performance has been to create multi-core devices.

Complex SoCs require a scalable and convenient method of connecting a variety of peripheral blocks such as processors, accelerators, shared memory and IO devices while addressing the power, performance and cost requirements of the end application. Due to the complexity and high performance requirements of these devices, the chip interconnect tends to be hierarchical and partitioned depending on the latency tolerance and bandwidth requirements of the endpoints. The connectivity among the endpoints tends to be more flexible to allow for future devices that may be derived from a current device. In this scenario, synchronization of accesses to a shared resource that may receive transaction packets through an interconnect fabric may be difficult.

BRIEF DESCRIPTION OF THE DRAWINGS

Particular embodiments in accordance with the invention will now be described, by way of example only, and with reference to the accompanying drawings.

Figure 1:
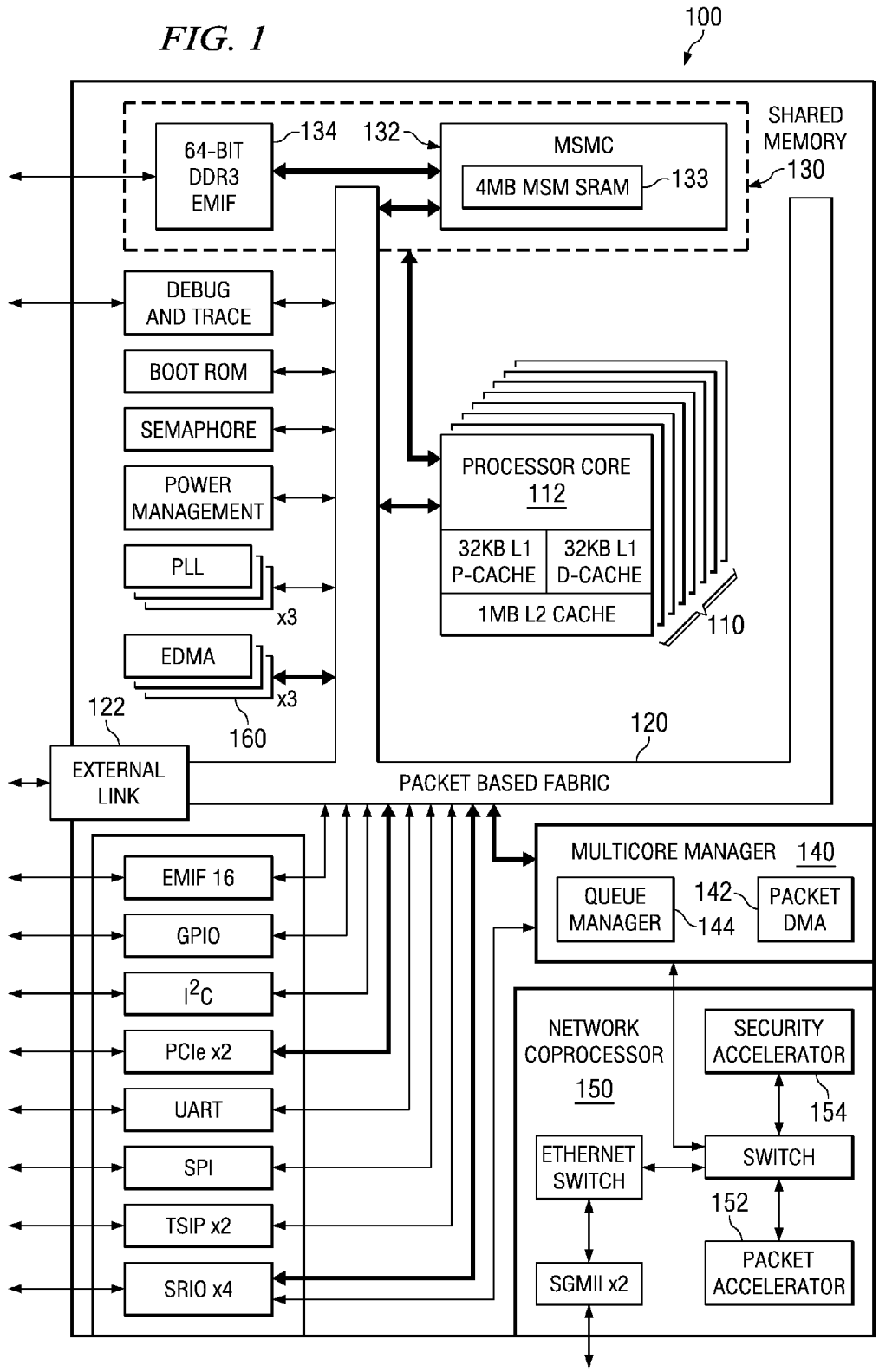
FIG. 1 is a functional block diagram of a system on chip (SoC) that includes an embodiment of the invention.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

In an embodiment that will be described in more detail below, multiple cores are interconnected via a packet based switch fabric that provides point to point interconnect between several devices on each cycle. Each core may receive requests from another core or from other external devices within the SoC to access various shared resources within the core, such as static random access memory (SRAM). Local SRAM memory accesses may be initiated by an external master via an interface within the core referred to as the SDMA (slave DMA). These external accesses (reads and writes) may be sent to a level 1 program (L1P) cache, a level 1 data (L1D) cache, or a level 2 (L2) cache depending on the address requested. Data and status are returned on reads and status on writes to the external master. A central routing module called the external memory controller (EMC) routes external access to the respective endpoint within the core after decoding the address.

An application being executed by the local instruction processor (CPU) in a core may need to know the status of all the transactions initiated by the processor, including any system initiated transactions such as direct memory access (DMA) moves of block of data and cache coherence operations. An application may keep track of all the transfers that it initiates, (DMA, coherence etc) by polling various processor registers associated with resource to ensure completion of the tasks. However, in a multi-core environment in which multiple processors may initiate transaction requests, ad hoc transaction status tracking based on each master becomes very difficult and a hardware based solution is needed.

Embodiments of the invention solve this problem by providing a status reporting mechanism that will keep track of transactions based on each master. It may also report transaction status based on all the transactions pending in the memory system from various masters.

As will be explained in more detail below, a memory system may process various data operations and program fetches from a local CPU simultaneously along with several incoming DMA requests from some other external masters in the system. The memory system keeps track of all the internal state machines based on each master and guarantees completion of all outstanding transactions. This reporting mechanism makes it easier to synchronize memory requests to a particular endpoint that may arrive by different paths, as well as to implement certain multiprocessor algorithms that require memory accesses to occur in a particular order from various CPU's perspective.

In one embodiment, a specialized status register referred to as a fence register (FenceR) is provided that indicates whether the memory system has gone idle. Checking the contents of the FencR allows a program to know when all of its outstanding traffic has landed at its intended endpoint.

In another embodiment, a specialized instruction referred to as a memory fence (MFENCE) instruction is provided that stalls the instruction execution pipeline until all outstanding traffic has landed at its intended endpoint.

In this manner, one set of memory transactions may be separated, or fenced, from another set of memory transactions.

FIG. 1 is a functional block diagram of a system on chip (SoC) 100 that includes an embodiment of the invention. System 100 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with shared memory 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678- Multi-core Fixed and Floating-Point Signal Processor Data Manual", SPRS691, November 2010, which is incorporated by reference herein.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 100 includes shared memory 130, comprising internal and external memory connected through the multi-core shared memory controller (MSMC) 132. MSMC 132 allows processor modules 110 to dynamically share the internal and external memories for both program and data. The MSMC internal RAM offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface 134, rather than to chip system interconnect as has traditionally been done on embedded processor architectures, providing a fast path for software execution. In this embodiment, external memory may be treated as SL3 memory and therefore cacheable in L1 and L2.

SoC 100 may also include several co-processing accelerators that offload processing tasks from the processor cores in processor modules 110, thereby enabling sustained high application processing rates. SoC 100 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including: IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 100 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Figure 2:
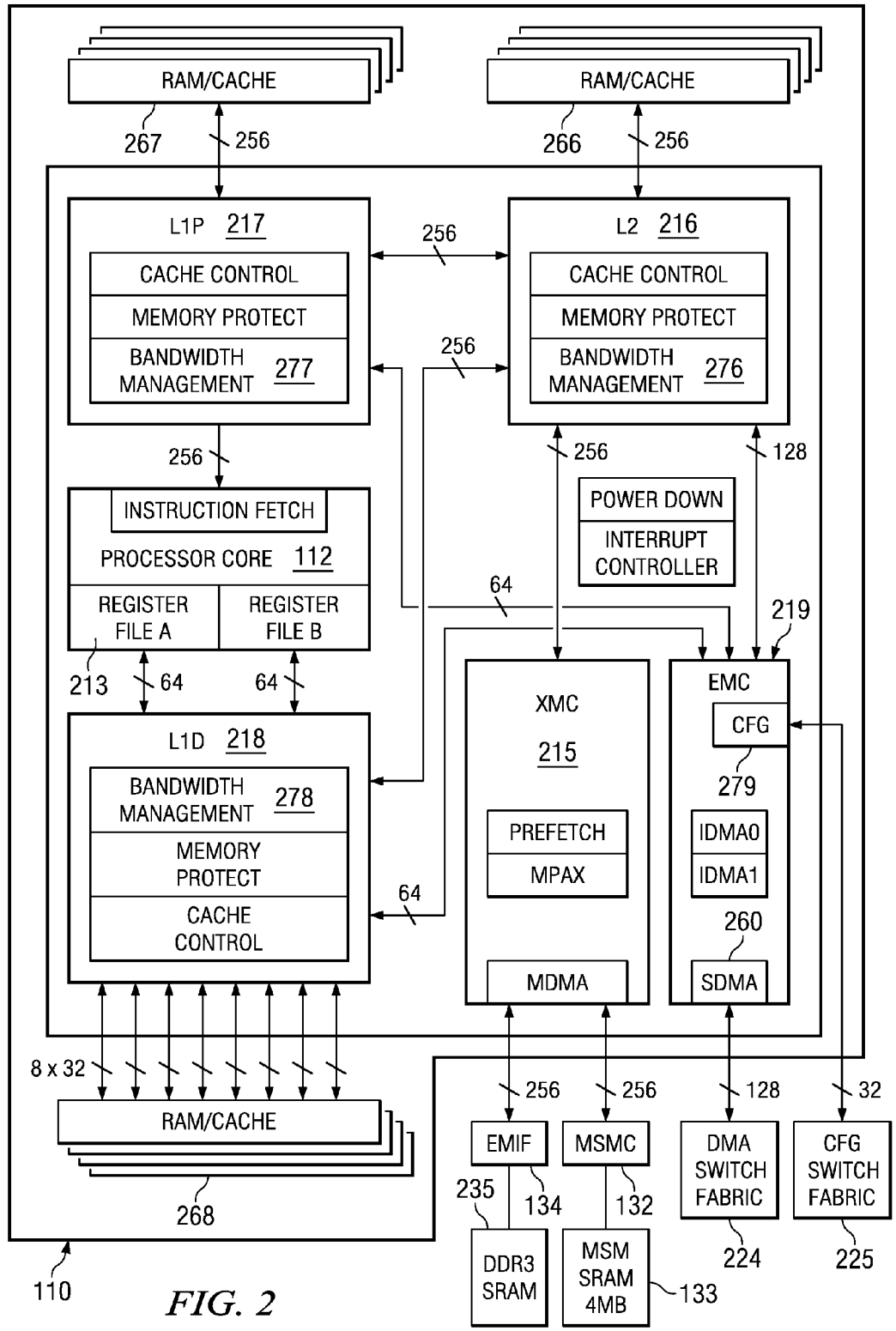
FIG. 2 is a more detailed block diagram of one core processing module used in the SoC of FIG. 1.

FIG. 2 is a more detailed block diagram of one processing module 110 used in the SoC of FIG. 1. As mentioned above, SoC 100 contains two switch fabrics that form the packet based fabric 120 through which masters and slaves communicate. A data switch fabric 224, known as the data switched central resource (SCR), is a high-throughput interconnect mainly used to move data across the system. The data SCR is further divided into two smaller SCRs. One connects very high speed masters to slaves via 256-bit data buses running at a DSP/2 frequency. The other connects masters to slaves via 128-bit data buses running at a DSP/3 frequency. Peripherals that match the native bus width of the SCR it is coupled to can connect directly to the data SCR; other peripherals require a bridge.

A configuration switch fabric 225, also known as the configuration switch central resource (SCR), is mainly used to access peripheral registers. The configuration SCR connects the each processor module 110 and masters on the data switch fabric to slaves via 32-bit configuration buses running at a DSP/3 frequency. As with the data SCR, some peripherals require the use of a bridge to interface to the configuration SCR.

Bridges perform a variety of functions:
Conversion between configuration bus and data bus.
Width conversion between peripheral bus width and SCR bus width.
Frequency conversion between peripheral bus frequency and SCR bus frequency.

The priority level of all master peripheral traffic is defined at the boundary of switch fabric 120. User programmable priority registers are present to allow software configuration of the data traffic through the switch fabric. In this embodiment, a lower number means higher priority. For example: PRI=000b=urgent, PRI=111 b=low.

All other masters provide their priority directly and do not need a default priority setting. Examples include the processor module 110, whose priorities are set through software in a unified memory controller (UMC) 216 control registers. All the Packet DMA based peripherals also have internal registers to define the priority level of their initiated transactions.

DSP processor core 112 includes eight functional units (not shown), two register files 213, and two data paths. The two general-purpose register files 213 (A and B) each contain 32 32-bit registers for a total of 64 registers. The general-purpose registers can be used for data or can be data address pointers. The data types supported include packed 8-bit data, packed 16-bit data, 32-bit data, 40-bit data, and 64-bit data. Multiplies also support 128-bit data. 40-bit-long or 64-bit-long values are stored in register pairs, with the 32 LSBs of data placed in an even register and the remaining 8 or 32 MSBs in the next upper register (which is always an odd-numbered register). 128-bit data values are stored in register quadruplets, with the 32 LSBs of data placed in a register that is a multiple of 4 and the remaining 96 MSBs in the next 3 upper registers.

The eight functional units (.M1, .L1, .D1, .S1, .M2, .L2, .D2, and .S2) (not shown) are each capable of executing one instruction every clock cycle. The .Mfunctional units perform all multiply operations. The .S and .L units perform a general set of arithmetic, logical, and branch functions. The .D units primarily load data from memory to the register file and store results from the register file into memory. Each .Munit can perform one of the following fixed-point operations each clock cycle: four 32×32 bit multiplies, sixteen 16×16 bit multiplies, four 16×32 bit multiplies, four 8×8 bit multiplies, four 8×8 bit multiplies with add operations, and four 16×16 multiplies with add/subtract capabilities. There is also support for Galois field multiplication for 8-bit and 32-bit data. Many communications algorithms such as FFTs and modems require complex multiplication. Each .Munit can perform one 16×16 bit complex multiply with or without rounding capabilities, two 16×16 bit complex multiplies with rounding capability, and a 32×32 bit complex multiply with rounding capability. The .Munit can also perform two 16×16 bit and one 32×32 bit complex multiply instructions that multiply a complex number with a complex conjugate of another number with rounding capability.

Communication signal processing also requires an extensive use of matrix operations. Each .Munit is capable of multiplying a [1×2] complex vector by a [2×2] complex matrix per cycle with or without rounding capability. Another version may provide multiplication of the conjugate of a [1×2] vector with a [2×2] complex matrix, for example. Each .Munit also includes IEEE floating-point multiplication operations, which includes one single-precision multiply each cycle and one double-precision multiply every 4 cycles. There is also a mixed-precision multiply that allows multiplication of a single-precision value by a double-precision value and an operation allowing multiplication of two single-precision numbers resulting in a double-precision number. Each .Munit can also perform one the following floating-point operations each clock cycle: one, two, or four single-precision multiplies or a complex single-precision multiply.

The .L and .S units support up to 64-bit operands. This allows for arithmetic, logical, and data packing instructions to allow parallel operations per cycle.

An MFENCE instruction is provided that will create a processor stall until the completion of all the processor-triggered memory transactions, including:
Cache line fills
Writes from L1D to L2 or from the processor module to MSMC and/or other system endpoints
Victim write backs
Block or global coherence operation
Cache mode changes
Outstanding XMC prefetch requests.

The MFENCE instruction is useful as a simple mechanism for programs to wait for these requests to reach their endpoint. It also provides ordering guarantees for writes arriving at a single endpoint via multiple paths, multiprocessor algorithms that depend on ordering, and manual coherence operations.

Each processor module 110 in this embodiment contains a 1024KB level-2 memory (L2) controller 216, a 32KB level-1 program memory (L1P) controller 217, and a 32KB level-1 data memory (L1D) controller 218. The device also contains a 4096 KB multi-core shared memory (MSM) 132. All memory in SoC 100 has a unique location in the memory map.

Figure 3:
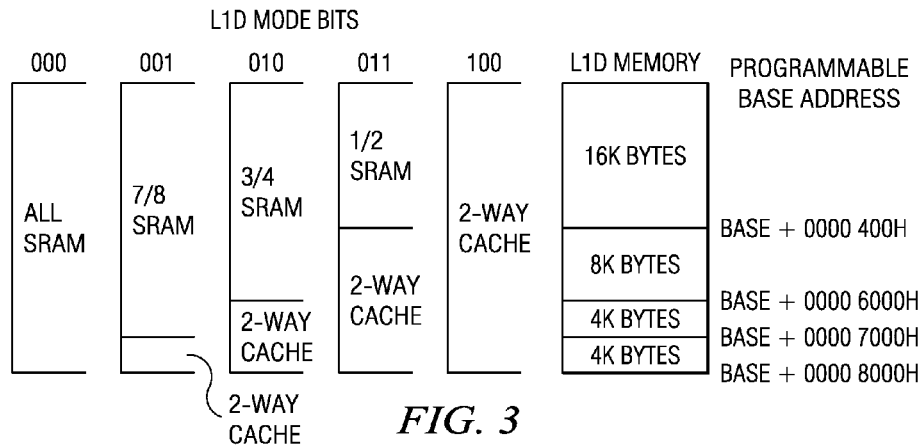
FIGS. 3 and 4 illustrate configuration of L1 and L2 caches.

The L1P cache 267 and L1D cache 266 can be reconfigured via software through the L1PMODE field of the L1P Configuration Register (L1 PCFG) and the L1DMODE field of the L1D Configuration Register (L1 DCFG) of each processor module 110 to be all SRAM, all cache memory, or various combinations as illustrated in FIG. 3, which illustrates an L1 D configuration; L1 P configuration is similar. L1 D is a two-way set-associative cache, while L1 P is a direct-mapped cache.

Figure 4:
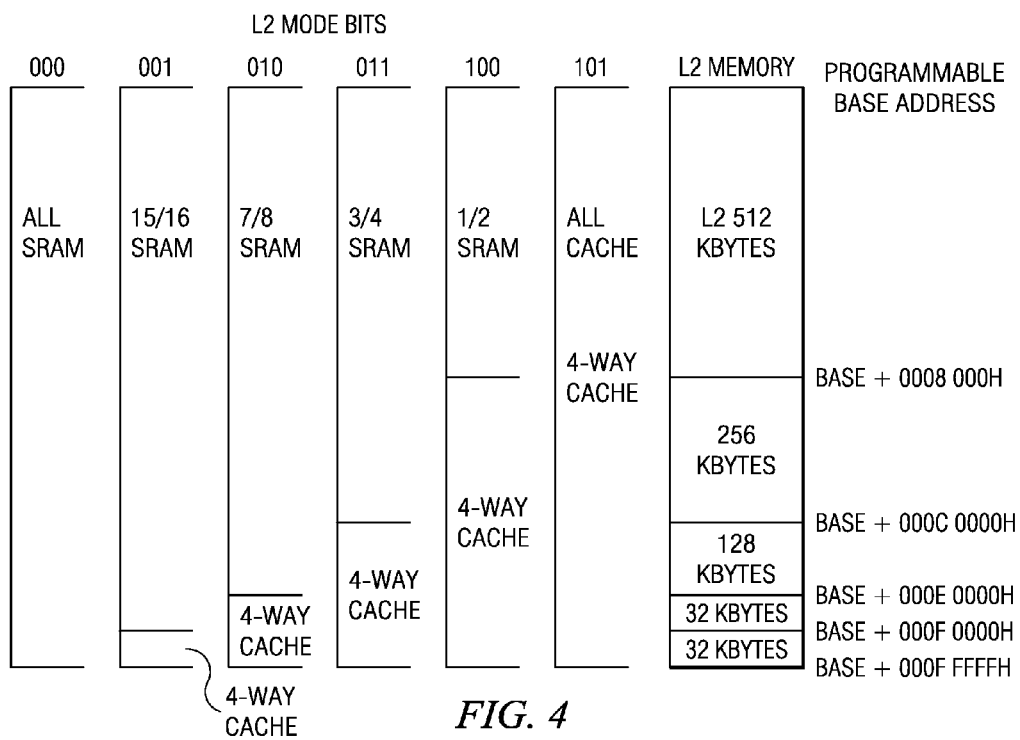

L2 memory 268 can be configured as all SRAM, all 4-way set-associative cache, or a mix of the two, as illustrated in FIG. 4. The amount of L2 memory that is configured as cache is controlled through the L2MODE field of the L2 Configuration Register (L2CFG) of each processor module 110.

Global addresses are accessible to all masters in the system. In addition, local memory can be accessed directly by the associated processor through aliased addresses, where the eight MSBs are masked to zero. The aliasing is handled within each processor module 110 and allows for common code to be run unmodified on multiple cores. For example, address location 0x10800000 is the global base address for processor module 0's L2 memory. DSP Core 0 can access this location by either using 0x10800000 or 0x00800000. Any other master in SoC 100 must use 0x10800000 only. Conversely, 0x00800000 can by used by any of the cores as their own L2 base addresses.

Level 1 program (L1P) memory controller (PMC) 217 controls program cache memory 267 and includes memory protection and bandwidth management. Level 1 data (L1D) memory controller (DMC) 218 controls data cache memory 268 and includes memory protection and bandwidth management. Level 2 (L2) memory controller, unified memory controller (UMC) 216 controls L2 cache memory 266 and includes memory protection and bandwidth management. External memory controller (EMC) 219 includes Internal DMA (IDMA) and a slave DMA (SDMA) interface that is coupled to data switch fabric 224. The EMC is coupled to configuration switch fabric 225. Extended memory controller (XMC) 215 includes a master DMA (MDMA) interface that is coupled to MSMC 132 and to dual data rate 3 (DDR3) external memory controller 134. MSMC 132 is coupled to on-chip shared memory 133. External memory controller 134 may be coupled to off-chip DDR3 memory 235 that is external to SoC 100. A master DMA controller (MDMA) within XMC 215 may be used to initiate transaction requests to on-chip shared memory 133 and to off-chip shared memory 235.

Referring again to FIG. 2, when multiple requestors contend for a single resource within processor module 110, the conflict is resolved by granting access to the highest priority requestor. The following four resources are managed by the bandwidth management control hardware 276-279:
  Level 1 Program (L1P) SRAM/Cache 217
  Level 1 Data (L1D) SRAM/Cache 218
  Level 2 (L2) SRAM/Cache 216
  EMC 219

The priority level for operations initiated within the processor module 110 are declared through registers within each processor module 110. These operations are:
  DSP-initiated transfers
  User-programmed cache coherency operations
  IDMA-initiated transfers The priority level for operations initiated outside the processor modules 110 by system peripherals is declared through the Priority Allocation Register (PRI_ALLOC). System peripherals that are not associated with a field in PRI_ALLOC may have their own registers to program their priorities.

Figure 5:
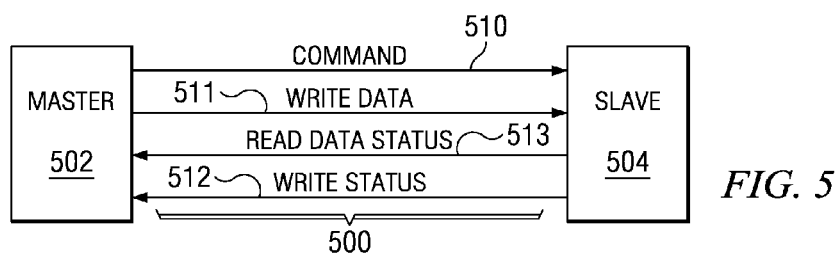
FIG. 5 is a simplified schematic of a portion of a packet based switch fabric used in the SoC of FIG. 1.

FIG. 5 is a simplified schematic of a portion 500 of a packet based switch fabric 120 used in SoC 100 in which a master 502 is communicating with a slave 504. FIG. 5 is merely an illustration of a single point in time when master 502 is coupled to slave 504 in a virtual connection through switch fabric 120. This virtual bus for modules (VBusM) interface provides an interface protocol for each module that is coupled to packetized fabric 120. The VBUSM interface is made up of four physically independent sub-interfaces: a command interface 510, a write data interface 511, a write status interface 512, and a read data/status interface 513. While these sub-interfaces are not directly linked together, an overlying protocol enables them to be used together to perform read and write operations. In this figure, the arrows indicate the direction of control for each of the sub-interfaces.

Information is exchanged across VBusM using transactions that are comprised at the lowest level of one or more data phases. Read transactions on VBusM can be broken up into multiple discreet burst transfers that in turn are comprised of one or more data phases. The intermediate partitioning that is provided in the form of the burst transfer allows prioritization of traffic within the system since burst transfers from different read transactions are allowed to be interleaved across a given interface. This capability can reduce the latency that high priority traffic experiences even when large transactions are in progress.

VBusM Write Operation

A write operation across the VBusM interface begins with a master transferring a single command to the slave across the command interface that indicates the desired operation is a write and gives all of the attributes of the transaction. Beginning on the cycle after the command is transferred, if no other writes are in progress or at most three write data interface data phases later if other writes are in progress, the master transfers the corresponding write data to the slave across the write data interface in a single corresponding burst transfer. Optionally, the slave returns zero or more intermediate status words (sdone==0) to the master across the write status interface as the write is progressing. These intermediate status transactions may indicate error conditions or partial completion of the logical write transaction. After the write data has all been transferred for the logical transaction (as indicated by cid) the slave transfers a single final status word (sdone==1) to the master across the write status interface which indicates completion of the entire logical transaction.

VBusM Read Operation

A read operation across the VBusM interface is accomplished by the master transferring a single command to the slave across the command interface that indicates the desired operation is a read and gives all of the attributes of the transaction. After the command is issued, the slave transfers the read data and corresponding status to the master across the read data interface in one or more discreet burst transfers.

Figure 6:
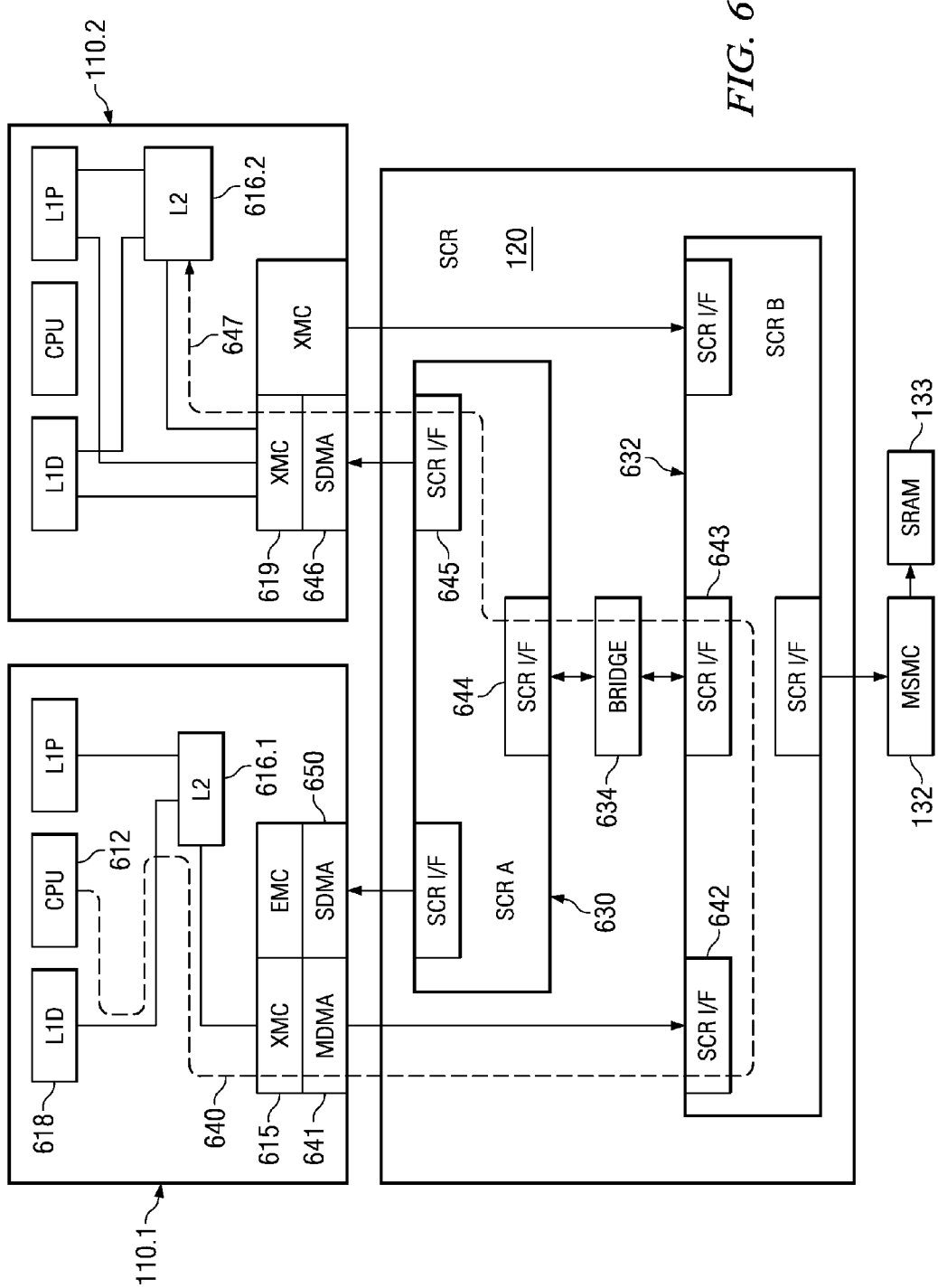
FIG. 6 is a block diagram illustrating flow of a transaction between two processor modules in the SoC of FIG. 1.

FIG. 6 is a block diagram illustrating flow of a transaction between two processor core modules in the SoC of FIG. 1. While only two core modules 110.1, 110.2 are illustrated, embodiments of SoC 100 may contain more than two cores, such as four, eight or more. In this embodiment, there are two interconnected switch fabrics SCR-A 630 and SCR-B 632 that are connected by a bridge 634. Each core 110.1, 110.2 is coupled to SCR-A 630 using a slave interface coupled to respective SDMA interfaces 649 and 650 in the EMC of each core. Each core has an MDMA interface in the XMC coupled to a master interface in SCR-B 632.

An example transaction 640 may be initiated by CPU 612 in core 110.1 to a memory address that is actually assigned to a memory location in the shared memory of L2 cache 616.2 in the core 110.2. The transaction is first routed to L1D 618. If the requested data is not in L1D cache 618, then the transaction request is routed to L2 cache 616.1. If the requested data is not in L2 cache 616.1, then the transaction request is routed to XMC 615 to make an external request to core 110.2, based on the address of the transaction request. MDMA interface 641 then launches a request into SCR-B 632 via master SCR interface 642. Based on address decoding, the transaction is routed to slave SCR interface 643 and then to bridge 634 and thereby to SCR-A 630 via master SCR interface 644. SCR-A 630 then routes the transaction request to slave SCR interface 645 and thereby to SDMA interface 646 that is part of EMC 619 in core 110.2.

Routing logic within EMC 619 then routes a modified request 647 to shared SRAM within L2 cache 616.2 after stripping off control and status information that is not needed for a local request. A large amount of command and status information may be required by the protocol used to control the SCR that is not needed for an internal access within the core. This locally unneeded information may be stored in a bypass buffer for later use. A buffer ID may then included in the modified request 647 that is sent to L2 SRAM 616.2.

This modified request may then go through an arbitration process with other requests from the L1D and L1P cache in core 110.2. Once the modified transaction is given access to shared SRAM 616.2, read data and status is then provided to EMC 619 along with the buffer ID value for that request if the request was for a read. If the request was a write, then completion status and the buffer ID is provided to EMC 619. The buffer ID value is then used to access the bypass buffer in EMC 619 and the stored command and status information is appended to the reply information. Some of the information that was stored in the bypass buffer may then be used to correctly route the transaction response data/status back through the switch fabric to core 110.1 where it is finally loaded into L1D cache 618 and provided to CPU 612.

Requester Based Transaction Status

Thus, it can be seen that it may be difficult for an application being executed on CPU 612 to keep track of when transaction 640 is completely finished. Embodiments of the invention solve this problem by providing a status reporting mechanism that will keep track of transactions based on each master. It may also report transaction status based on all the transactions pending in the memory system from various masters.

As will be explained in more detail below, the memory system within each core, such as core 110.1, may process various data operations and program fetches from local CPU 612 simultaneously along with incoming DMA requests from some other external masters in the system via SDMA 650. The memory system keeps track of all the internal state machines based on each master and guarantees completion of all outstanding transactions. This reporting mechanism makes it easier to synchronize memory requests to a particular endpoint that may arrive by different paths, as well as to implement certain multiprocessor algorithms that require memory accesses to occur in a particular order from various CPU's perspective.

In one embodiment, a specialized status register referred to as a fence register (FenceR) is provided that indicates whether the memory system has gone idle. Checking the contents of the FenceR allows a program to know when all of its outstanding traffic has landed at its intended endpoint.

In another embodiment, a specialized instruction referred to as a memory fence (MFENCE) instruction is provided that stalls the instruction execution pipeline until all outstanding traffic has landed at its intended endpoint.

Figure 7:
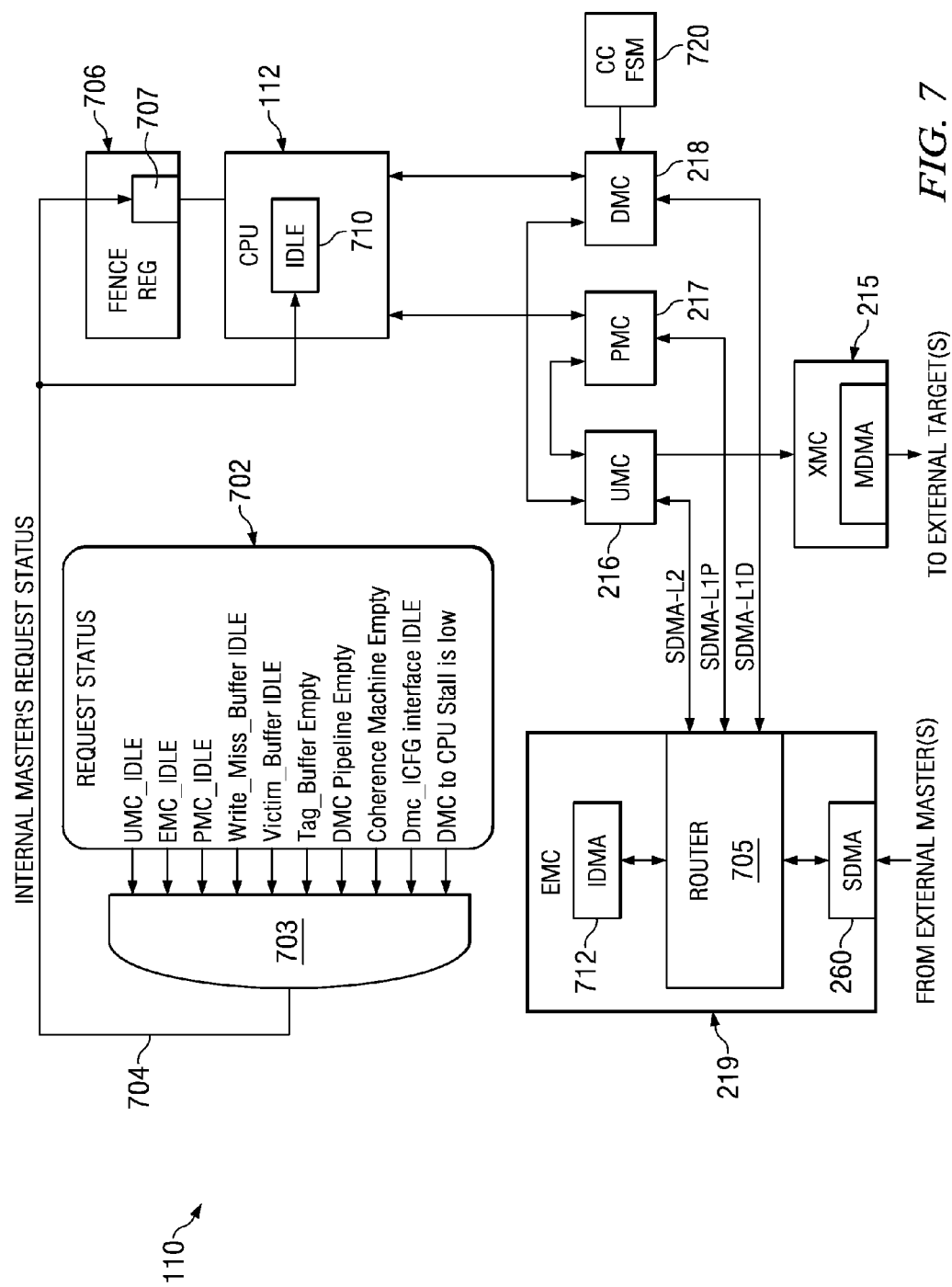
FIG. 7 is a block diagram of a requester based memory system idle status detection within the core of FIG. 2.

FIG. 7 is a block diagram of a requester based memory system idle status detection within core 110 of FIG. 2 and similarly in FIG. 6 for each core 110.1, 110.2. In this embodiment, fence register 706 indicates whether the CPU initiated transactions in the memory system have completed and the memory system has gone idle. This allows programs to know when all of their outstanding traffic has landed at its intended endpoint.

Figure 8:
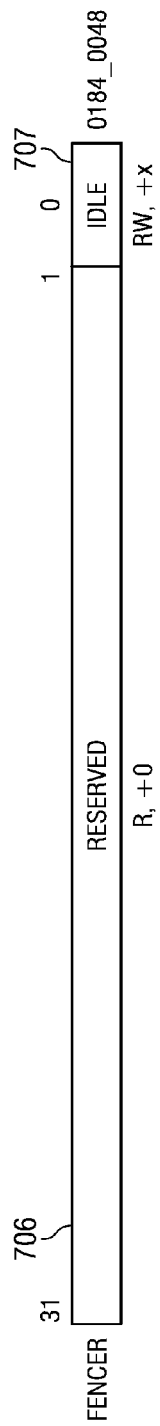
FIG. 8 is an illustration of a Fence Register in the core of FIG. 2.

FIG. 8 is an illustration of fence register 706 in each core 110. One bit 707 is set to an asserted logic level when idle signal 704 is asserted. In this embodiment, FenceR 706 is a memory mapped register that may be accessed by any memory read instruction executed by CPU 112. For example, in this embodiment, FenceR 706 is located at memory address 0184_0048; however, in other embodiments a different address may be used. Idle bit 707 may be reset by writing a logic "0" using a memory write instruction.

In another embodiment, FenceR 706 may be a register that is internal to CPU 112 rather than being memory mapped. In such an embodiment, it may be part of a status register, or other CPU register resource that may be accessed by an instruction executed by CPU 112.

IDLE Status Computation

IDLE bit 707 indicates whether the memory system has gone idle since it was last cleared. That is, a program may first clear IDLE bit 707, and then poll FENCER.IDLE 707 until IDLE=1. IDLE bit 707 remains set until the program clears the IDLE bit again. This allows the program to determine that all activity issued before clearing IDLE has landed in the system. The polling loop itself should poll slowly enough so as not to disrupt the IDLE computation. An example idle status check is illustrated in Table 1.

When IDLE=1, all in-flight CPU-triggered memory system activity initiated before clearing IDLE has landed. When IDLE=0, the memory system has not yet been observed to be idle. The IDLE computation includes all outstanding transactions associated with CPU 112 requests, such as the following:

Cache line fills
Writes from L1D to L2 or from core 110 to MSMC and/or to other system endpoints
Victim write backs
Block or global coherence operations
Cache mode changes In various embodiments, PMC activity and XMC prefetch activity may be either included or not included in the IDLE computation, as desired for a given system. A write transaction that has left core 110 is considered complete only when its VBusM write status has returned to core 110.

In this embodiment, SDMA activity caused by an external master requesting access to a target resource within core 110 is not included in the IDLE computation. Thus, status of transactions initiated only by the CPU is reported, which is important in many cases. For each master in the system, a program may need to be able to uniquely determine if all the transactions initiated by that master have completed in the memory system. Also, since the FenceR register is memory mapped and has a global address, a CPU in one core may check the idle status of memory transactions initiated by CPUs in other cores within the SoC. In another embodiment, a FENCE operation may also be performed on SDMA initiated transactions from external masters, as will be described with regard to FIG. 9.

Referring again to FIG. 7, request monitoring status logic 702 monitors all of the various memory system activity points within core 110. Level 1 data cache controller 218 receives memory requests from CPU 112. As described above, a miss may trigger activity in level 2 cache controller 216 and in external memory controller 215. XMC 215 may initiate additional prefetch activity directed to MSMC 132 or to memory in other cores. Similarly, program cache 217 may initiate memory activity in L2 cache 216 and XMC 215. Internal DMA 712 may be triggered by a program executing on CPU 112 to transfer block of data to or from UMC 216, PMC 217 and DMC 218 via router 705. Cache coherence finite state machine 720 may also be controlled by a program executing on CPU 112 to force DMC 218 or UMC 216 to write back data to an upper level memory in order to maintain coherency between the various hierarchical levels of memory.

While several types of memory activity are illustrated in this embodiment of request status logic 702 that pertain to the particular operation of core 110, other embodiments may include signals obtained from other memory resources provided in another embodiment that differ from what is illustrated here. Signals from all of the monitored memory system activity points are coupled to an "AND" gate 703 to produce a single idle status signal 704 that is asserted when all activity monitored by request status logic 702 has completed. Idle status signal 704 is coupled to FenceR 706 and sets idle bit 707 when signal 704 is asserted.

In this embodiment, idle signal 704 is also coupled to a status bit 710 that is internal to CPU 112. Status bit 710 may be part of a status register, for example, and may be used to control execution of an MFENCE instruction that will be described in more detail below.

Fence Operation Semantics

FENCER.IDLE bit 707 may be used in conjunction with a simple CPU loop to implement a fence operation. The purpose of the fence operation is to enforce sequential consistency between groups of memory accesses. All CPU data memory requests issued before the fence operation are complete and visible in memory before any CPU request issued after it. No data memory request issued before the fence operation may drift after it, and vice versa. This makes it easier to synchronize memory requests to a particular endpoint that may arrive by different paths, as well as to implement certain multiprocessor algorithms that require memory accesses to appear to occur in a particular order from all CPUs' perspective Fence operations do not make strong ordering guarantees on program fetch requests. They are intended primarily for ordering data accesses. Fence operations may however be used in conjunction with cache coherence operations to support self modifying code in limited circumstances. In this context, self modifying code refers to any case where recently written data is subsequently executed as code. This includes such things as program loaders that write the code image with normal CPU store instructions.

Table 1 illustrates code that may be used to implement a fence operation with FENCER.IDLE bit 707. Core 110 includes a software pipelining loop buffer (SPLOOP). The SPLOOP facility stores a single iteration of loop in a specialized buffer and contains hardware that will selectively overlay copies of the single iteration in a software pipeline manner to construct an optimized execution of the loop. This provides several benefits. Since the prolog and epilog of a SPLOOP loop do not need to be explicitly coded, code size is significantly reduced. The SPLOOP version of the loop may be easily interrupted. Since the instructions in the loop do not need to be fetched on each cycle from the instruction cache, the memory bandwidth and power requirements are reduced. While executing from the SPLOOP, the instruction cache may be powered down. Since the loop executes out of a buffer, the branch to the start of loop is implicit and thus not required. In some cases this may permit a tighter loop since an .S unit is freed for other use.

TABLE 1

Fence Operation Reference Assembly Code

| MVKL FENCER, A4 | ; \_ point to |
| MVKH FENCER, A4 | ; / FENCER register |
| ZERO A0 | ; Initialize predicate |
| STW A0, *A4 | ; Reset FENCER.IDLE |

TABLE 1-continued

Fence Operation Reference Assembly Code

| [!A0] SPLOOPW 14 | ; Execute from loop buffer |
| [!A0] LDW *A4, A0 | ; Read FENCER until IDLE=1 |
| NOP 4 | |
| NOP 8 | |
| NOP 1 | |
| SPKERNEL | ; Loop exits when IDLE=1 |

In this embodiment, the loop is a 14 cycle loop; therefore 14 cycles is the maximum transaction initiation interval supported by the SPLOOP buffer. If the memory hardware requires a longer interval to function properly, then the reference code of Table 1 will need to be modified accordingly.

The SPLOOP instruction invokes the loop buffer mechanism. When the SPLOOP instruction is predicated, it indicates that the loop is a nested loop using the SPLOOP reload capability. The decision of whether to reload is determined by the predicate register selected by the creg and z fields. The SPLOOPW instruction invokes buffer operation with delayed testing and no epilog. The SPKERNEL instruction is placed in parallel with the last execute packet of the SPLOOP code body indicating there are no more instructions to load into the loop buffer. The SPKERNEL instruction also controls at what point in the epilog the execution of post-SPLOOP instructions begins.

Interrupts and Fence Operations

As mentioned earlier, the fence operation may be interruptible. The fence operation still ensures sequential consistency between all accesses issued within the thread of execution that contains it. It does not make any strong guarantees between operations issued from that thread of execution and any accesses issued by interrupt handlers, or in the event of a context switch, other tasks executing on the same CPU. Programs can prevent interrupts and context switches during a fence operation if necessary by blocking interrupts around the fence loop, such as with the DINT and RINT instructions. Most programs, however, do not need to disable interrupts during fence operations.

The sticky nature of FENCER.IDLE bit will allow interrupted fence operations to complete more quickly on return if the interrupt handler does not clear FENCER.IDLE bit before returning.

MFENCE Instruction

The MFENCE instruction is a specialty instruction that will stall until the completion of all the CPU-triggered memory transactions, including: cache line fills; writes from L1D to L2 or from core 110 to MSMC and/or other system endpoints; cache line victim write backs; block or global coherence operations; cache mode changes; and outstanding XMC prefetch requests. To determine if all the memory transactions are completed, the MFENCE instruction monitors internal busy flag signal 704. In this embodiment, MFENCE may wait at least five pipeline cycles before checking the busy flag in order to account for pipeline delays.

The code in Table 2 illustrates a use of the MFENCE instruction.

TABLE 2

MFENCE example

| STW A0, *A1 | |
| MFENCE | ; This will wait until the STW write above |
| | ; has landed in its final destination |

During the course of executing a MFENCE operation, any enabled interrupts will still be serviced. When an interrupt occurs during the execution of a MFENCE instruction, the address of the execute packet containing the MFENCE instruction is saved in an interrupt return pointer (IRP) or non-maskable interrupt return pointer (NRP). This forces returning to the MFENCE instruction after interrupt servicing.

Figure 9:
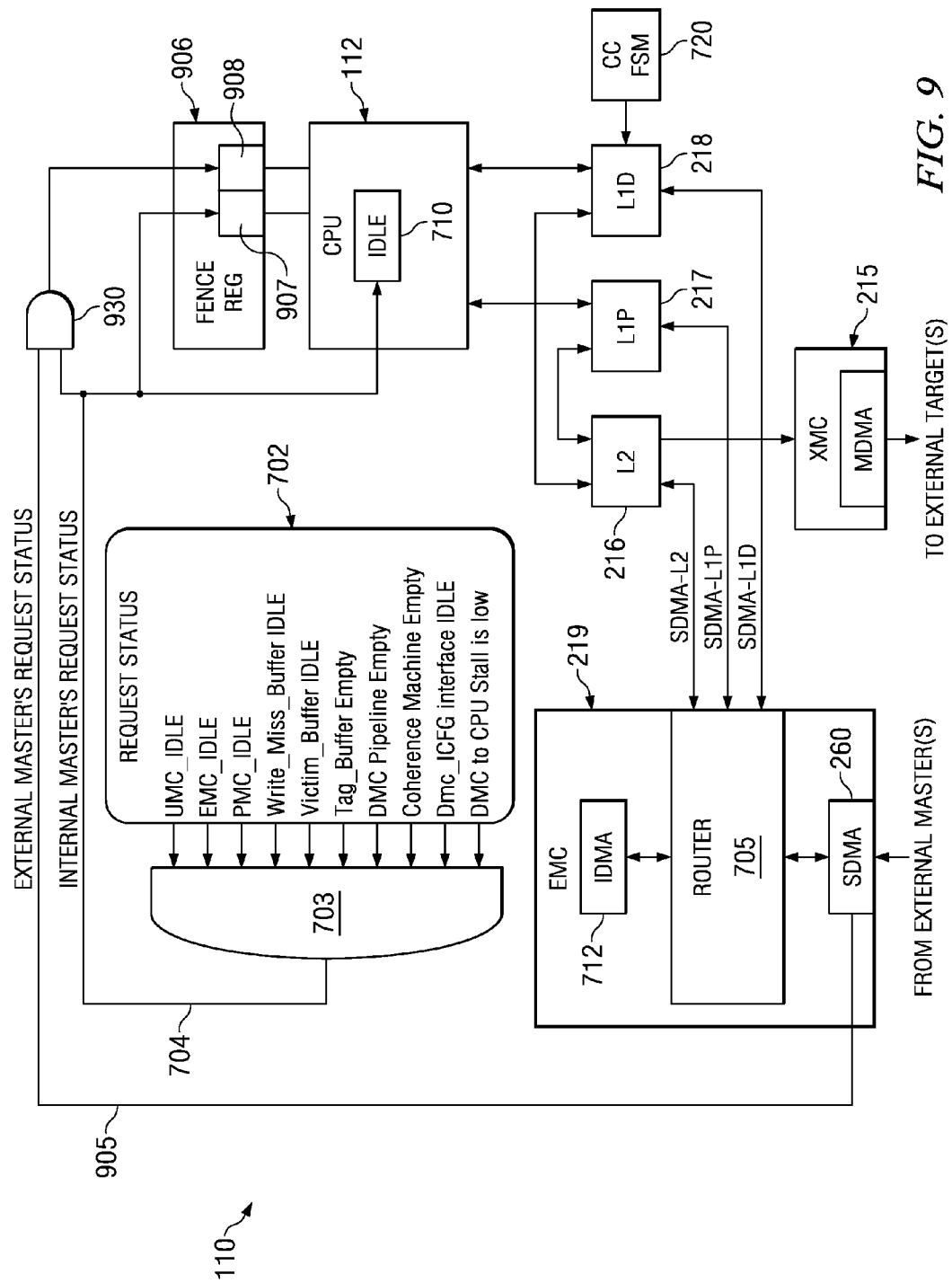
FIG. 9 is a block diagram of another embodiment of requester based memory system idle status detection.

FIG. 9 is a block diagram of another embodiment of requester based memory system idle status detection. In this embodiment, fence register 906 includes two bits. Idle bit 907 is similar to idle bit 707 in FIG. 7. Idle bit 908 is a combination of internal master status signal 704 that is asserted when all transactions initiated by local CPU 112 have completed and external master status signal 905 that is asserted when all transactions to memory resources within core module 110 initiated by external masters have completed. When status signals 704 and 905 are both asserted, AND gate 930 asserts a signal that in turn sets combined idle bit 908.

By testing idle bits 907, 908, a program being executed on CPU 112 may ensure that all data writes have landed at their endpoints and that all outstanding program-initiated cache coherence operations have completed. Idle bit 907 reports the status of transactions originated from local CPU core 112 alone without including DMA requests from other masters. Idle bit 908 reports status of all the transactions inside core 110 including requests originated from other masters.

In another embodiment, the idle signals may be reported differently. For example, external master request status signal 905 may be provided to FenceR 906 without being combined with signal 704. External master request status signal 905 may be provided directly to a status bit internal to CPU such as status bit 710 for use by an instruction such as the MFENCE instruction.

Figure 10:
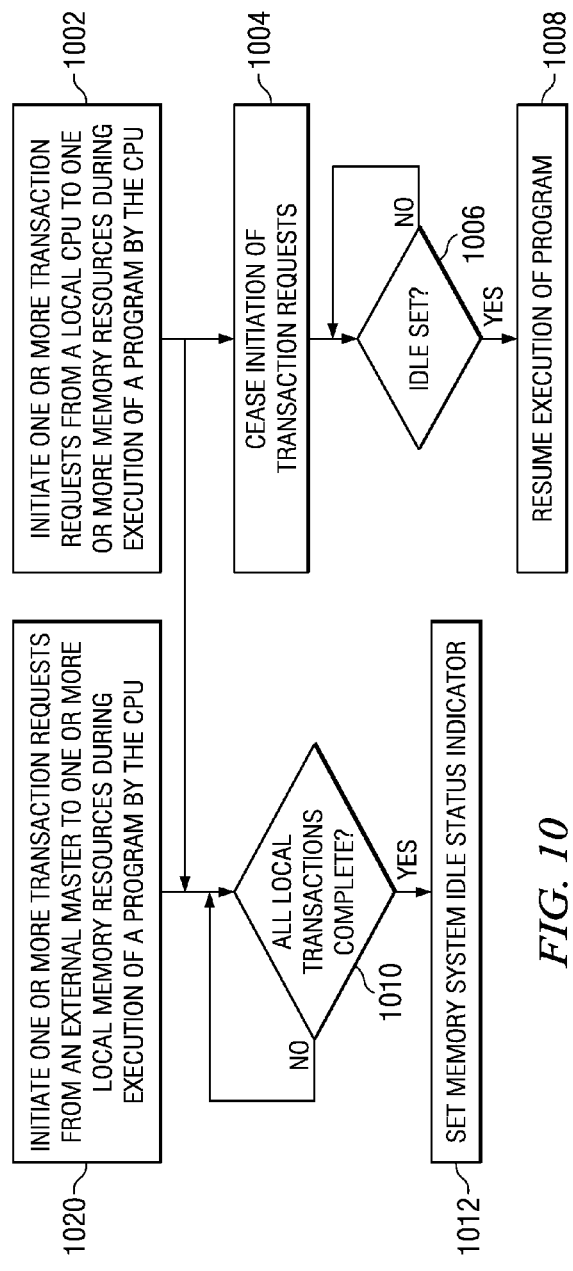
FIGS. 10-11 are flow diagrams illustrating operation of memory system idle detection.

FIG. 10 is a flow diagram illustrating operation of memory system idle detection a system having a plurality of memory resources accessible by a central processing unit (CPU). One or more transaction requests are initiated 1002 by the CPU for access to one or more of the memory resources. These transaction requests may be for accesses to a program cache or program memory, a data cache or data memory, level two cache, memory mapped registers, various memory mapped input/output devices, etc. These transaction requests may be the result of executing a program by the CPU that fetches instructions and reads or writes data, for example. An external master, such as a peripheral device or a CPU in another core within the system, may also initiate 1020 transaction requests to the local memory resources of the CPU.

The various memory resources, such as caches, memories, and registers, are monitored 1010 to determine when all of the transaction requests initiated by the CPU have been completed. An idle signal is provided 1012 that is accessible by the CPU that indicates the status of the transaction requests. The idle signal is asserted when all of the transaction requests initiated by the CPU have been completed. In this embodiment, transactions initiated 1020 by the external masters are excluded from the determination 1010 that the local transaction are complete.

Initiation of transaction requests may be ceased 1004 in order to establish a fence between one set of transactions and a later set of transactions. This effectively causes execution of an application program by the CPU to halt. While the initiation of transactions is ceased, the idle bit may be monitored 1006. Once the idle bit is set, 1006, execution of the program is resumed 1008.

In one embodiment, cessation of transaction request initiation 1004 may be accomplished by stalling execution of an instruction processing pipeline within the CPU during execution of a particular instruction, such as the MFENCE instruction described in more detail above. In this case, the execution of the MFENCE instruction stalls 1004 the instruction pipeline until the idle status indicator is set 1012. The idle status indicator may be a status bit internal to the CPU, for example.

In another embodiment, cessation of transaction request initiation 1004 may be accomplished by executing a software loop from a loop buffer within the CPU while monitoring 1010 the plurality of memory resources until the idle signal is asserted 1012. As described in more detail above, a software program loop (SPLOOP) buffer may be provided within the CPU that allows a software loop to be executed without initiating transaction requests to the program cache or program memory. In this embodiment, a memory mapped register such as the fence register described above may provide an idle bit that can be polled by the software loop. For example, an initial instruction can reset the idle bit by writing a logic zero value to it, and then the software loop can repeatedly read and test the bit 1006 until it is set to a logic one value 1012.

Figure 11:
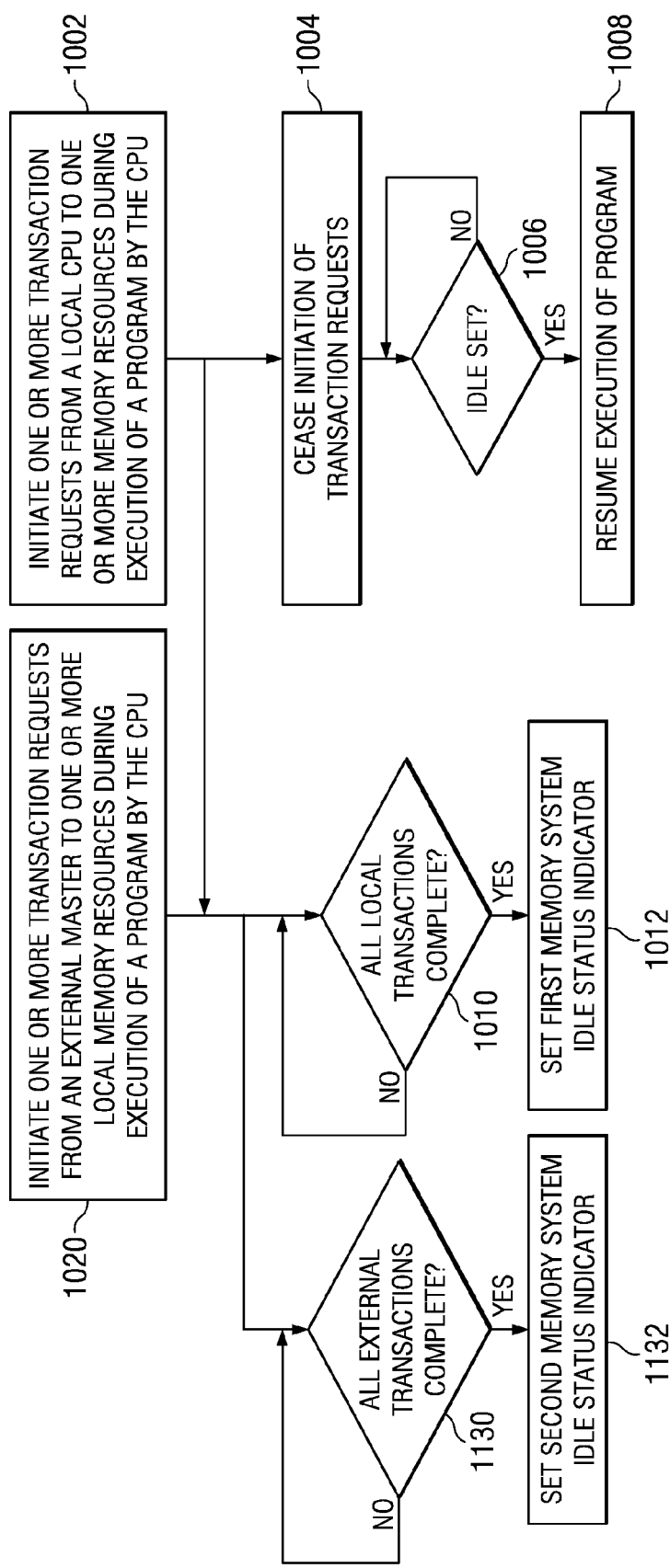

FIG. 11 is a flow diagram illustrating another embodiment in which transactions initiated by an external master 1020 to memory resources local to the CPU are monitored 1130 separately from the local CPU initiated transactions. In this embodiment, a second memory system idle indicator is set 1132 when all externally initiated transactions are complete. This indicator may be provided as a second bit in a register such as an internal status register or a fence register, for example. This second indicator may also be combined with the first idle indicator to provide an idle indicator that indicates all transactions initiated by the CPU and all transaction to memory resources local to the CPU by external masters have completed, for example.

Fence Operations and Self-Modifying Code (e.g. Program Loaders)

Fence operations ensure all data writes have landed at their endpoints and that all outstanding program-initiated cache coherence operations have completed. This makes them suitable for limited forms of self modifying code, such as program loaders, despite the fact that the fence operation otherwise does not enforce a strong ordering between program fetches and data accesses. To use fence operations for this purpose, a program may perform the following steps. First, load the program image in memory. This may include modifying the program image with direct CPU accesses, such as what a decompression/decryption algorithm might do. If the CPU does write directly to the program image, writeback-invalidate the corresponding address range from L1D.

Next, the corresponding range from L1P cache is invalidated using a "block cache invalidate" operation. Alternately, the entire L1P may be invalidated with a "global invalidate" operation.

A fence operation is then issued to ensure all writes from loading the image and all cache invalidates have completed. In this embodiment, fence operations do not synchronize with DMA controllers such as EDMA or IDMA. They are only useful for ensuring accesses from the CPU have finished.

A branch to the newly loaded program image may then be performed after the fence operation detects that the memory status is idle.

Program loading and cache invalidation may occur concurrently, thereby overlapping their cycle cost. The fence operation ensures both will have completed before continuing to the branch. A caveat exists with this approach; in this embodiment, the CPU pipeline fetches up to 128 bytes beyond the current instruction address. Thus, any code loaded in this fashion should be at least 128 bytes beyond the address range containing the fence operation loop, or at addresses completely below the address range containing the fence operation loop. Note that the fence operation is not strictly necessary when self-loading a program; however, the fence operation does make it easier to load a program that must be visible to CPUs other than the CPU writing the program image, by ensuring that all writes have landed in the endpoint. In that case, the program writing and cache invalidation operations may occur on different CPUs and additional synchronization may be necessary before branching to the newly loaded program.

Another example of an application that uses fence operation is where the CPU is running a DSP algorithm on a block of data, which gets refreshed periodically. The application may perform the following steps. First, the CPU reads a block of data into cache (L1 and/or L2). The CPU applies the signal processing algorithm on that block of data, which may include updating this data.

The CPU then kicks off a cache coherence operation that writes back this block of data to main memory. In this embodiment, referring again to FIG. 7, cache coherence state machine 720 includes memory mapped registers that may be loaded with an address range. CPU 112 may then issue a command to CCFSM 720 to write back any data within the designated memory range that is currently in cache 218.

The CPU then polls on FENCER.IDLE bit 707, or executes an Mfence instruction, in order to stall the CPU until the cache coherence operation is over. Once the memory idle bit is asserted during the fence operation, the CPU may assume that the new data has been written back to main memory.

The CPU may then refresh this data by reading another block of data to the cache. This will overwrite the original cached data, but since the Mfence has guaranteed that the data has been written back, it is ok. This is guaranteed by stalling the CPU and hence the reading of new data.

System Example

Figure 12:
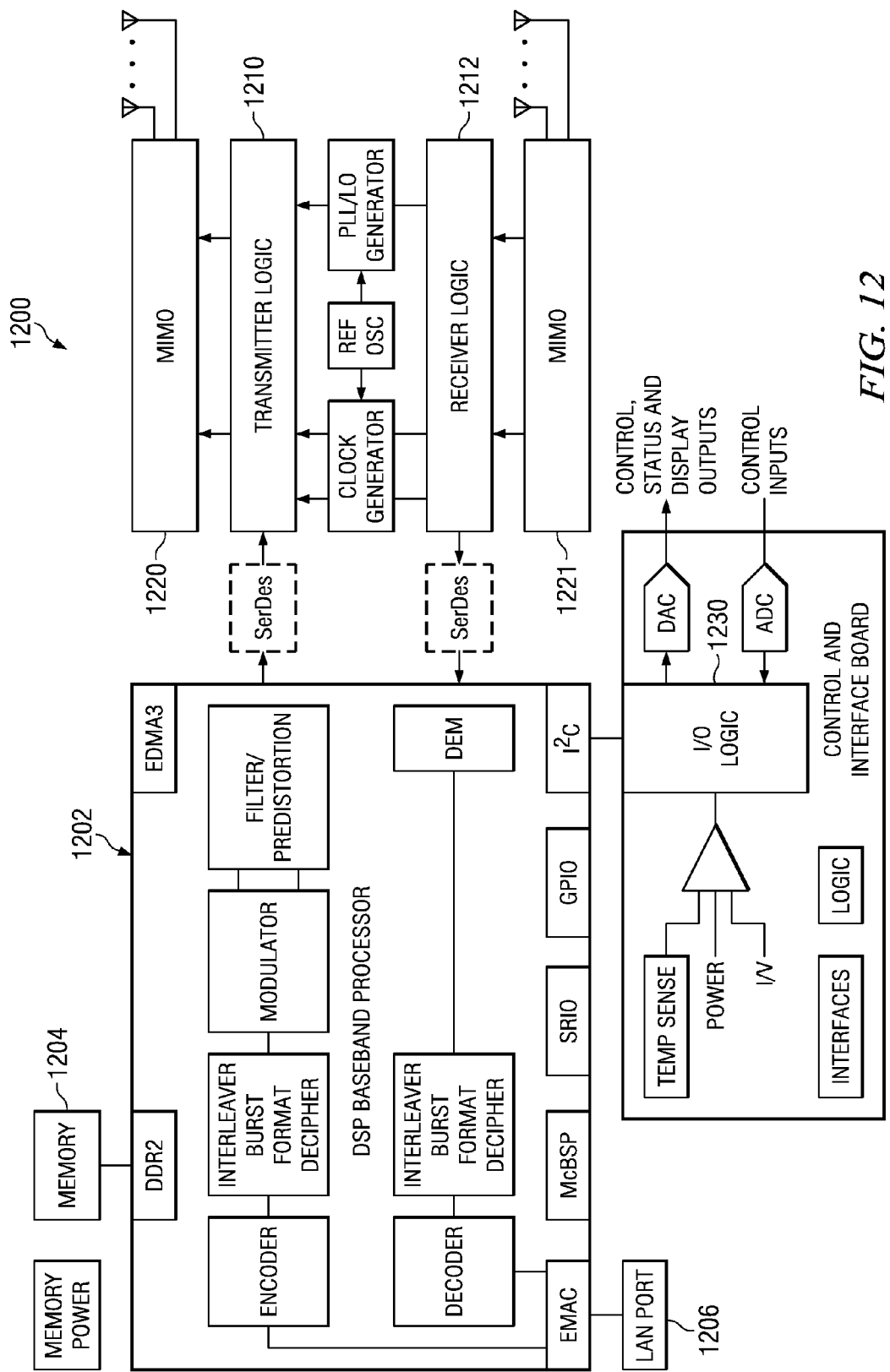
FIG. 12 is a block diagram of a system that includes the SoC of FIG. 1.

FIG. 12 is a block diagram of a base station for use in a radio network, such as a cell phone network. SoC 1202 is similar to the SoC of FIG. 1 and is coupled to external memory 1204 that may be used, in addition to the internal memory within SoC 1202, to store application programs and data being processed by SoC 1202. Transmitter logic 1210 performs digital to analog conversion of digital data streams transferred by the external DMA (EDMA3) controller and then performs modulation of a carrier signal from a phase locked loop generator (PLL). The modulated carrier is then coupled to multiple output antenna array 1220. Receiver logic 1212 receives radio signals from multiple input antenna array 1221, amplifies them in a low noise amplifier and then converts them to digital a stream of data that is transferred to SoC 1202 under control of external DMA EDMA3. There may be multiple copies of transmitter logic 1210 and receiver logic 1212 to support multiple antennas.

The Ethernet media access controller (EMAC) module in SoC 1202 is coupled to a local area network port 1206 which supplies data for transmission and transports received data to other systems that may be coupled to the internet.

An application program executed on one or more of the processor modules within SoC 1202 encodes data received from the internet, interleaves it, modulates it and then filters and pre-distorts it to match the characteristics of the transmitter logic 1210. Another application program executed on one or more of the processor modules within SoC 1202 demodulates the digitized radio signal received from receiver logic 1212, deciphers burst formats, and decodes the resulting digital data stream and then directs the recovered digital data stream to the internet via the EMAC internet interface. The details of digital transmission and reception are well known.

By providing fence operations to determine when all pending transactions initiated by a CPU are complete, cache coherence may be assured. This allows signal processing to be partitioned among several cores with SoC 1202. In this manner, performance of each core may be improved and data can be shared among the multiple cores within SoC 1202 such that data drops are avoided while transferring the time critical transmission data to and from the transmitter and receiver logic.

Input/output logic 1230 may be coupled to SoC 1202 via the inter-integrated circuit (I2C) interface to provide control, status, and display outputs to a user interface and to receive control inputs from the user interface. The user interface may include a human readable media such as a display screen, indicator lights, etc. It may include input devices such as a keyboard, pointing device, etc.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, in another embodiment, a different interconnect topology may be embodied. Each topology will need to be analyzed to determine which memory resources should be monitored to determine when transactions initiated by a local CPU and by external masters are completed, as described herein. For example, in some embodiments, instruction fetch transactions may be included, while in another embodiment they may be ignored.

In another embodiment, idle indicators for local CPU transactions and for external master transactions may be combined or provided as separate idle indicators, for example.

In another embodiment, a fence operation may be performed by other means then a fence instruction or a fence register. For example, a control bit may be set by an instruction. The control bit may control stalling of program execution until transactions are completed.

In another embodiment, the shared resource may be just a memory that is not part of a cache. The shared resource may by any type of storage device or functional device that may be accessed by multiple masters in which only a portion of interconnect protocol information is needed to perform a local access to the shared resource.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

While the term "fence" has been used herein to denote an operation that allows one set of transactions to be separated from another set of transactions, in other embodiments a different term may be used. Thus, in another embodiment another term may be used for the MFENCE instruction or for the fence register. The term "fence" within the claims is intended to cover similar instructions and registers that are called by different names.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method of operating a system having memory resources accessible by a central processing unit (CPU), the method comprising:
    initiating one or more transaction requests by the CPU for access to one or more of the memory resources;
    ceasing initiation of transaction requests;
    monitoring the memory resources to determine when all of the transaction requests initiated by the CPU has been completed;
    providing an idle signal accessible by the CPU that is asserted when all of the transaction requests initiated by the CPU have been completed; and
    wherein ceasing initiation of transaction requests comprises executing a software loop from a loop buffer within the CPU while monitoring the plurality of memory resources until the idle signal is asserted.

2. The method of claim 1, wherein ceasing initiation of transaction requests comprises stalling execution of instructions by the CPU until the idle signal is asserted and then resuming execution of instructions by the CPU.

3. The method of claim 1, wherein a portion of the memory system and the CPU are located in a core module, and wherein the portion of the memory system in the core module is accessible by one or more external masters, and wherein the monitoring is performed separately for transaction requests from the CPU and for transaction requests from the one or more external masters, such that the idle signal indicates when the memory resources have completed all pending transaction requests from the CPU, even when a transaction request from the one or more external masters is still pending.

4. The method of claim 3, further comprising providing a second idle signal accessible by the CPU that indicates when the memory resources have completed all pending transaction requests from the CPU and from the one or more external masters.

5. A method of operating a system having memory resources accessible by a central processing unit (CPU), the method comprising:
    initiating one or more transaction requests by the CPU for access to one or more of the memory resources;
    ceasing initiation of transaction requests;
    monitoring the memory resources to determine when all of the transaction requests initiated by the CPU has been completed; and
    providing an idle signal accessible by the CPU that is asserted when all of the transaction requests initiated by the CPU have been completed;
    wherein assertion of the idle signal asserts an idle bit in a memory mapped register that is accessible by a memory access instruction executed by the CPU; and
    wherein ceasing initiation of transaction requests comprises executing a software loop from a loop buffer within the CPU while monitoring the plurality of memory resources until the idle signal is asserted, wherein the software loop polls the idle bit until the idle bit is asserted.

6. The method of claim 5, wherein ceasing initiation of transaction requests comprises stalling execution of instructions by the CPU until the idle signal is asserted and then resuming execution of instructions by the CPU.

7. The method of claim 5, wherein a portion of the memory system and the CPU are located in a core module, and wherein the portion of the memory system in the core module is accessible by one or more external masters, and wherein the monitoring is performed separately for transaction requests from the CPU and for transaction requests from the one or more external masters, such that the idle signal indicates when the memory resources have completed all pending transaction requests from the CPU, even when a transaction request from the one or more external masters is still pending.

8. The method of claim 7, further comprising providing a second idle signal accessible by the CPU that indicates when the memory resources have completed all pending transaction requests from the CPU and from the one or more external masters.

9. A system comprising a module, the module comprising:
    one or more memory resources coupled to a local processing unit (CPU) located within the module, wherein the CPU is configured to initiate transaction requests to the one or more memory resources;
    monitoring logic coupled to the one or more memory resources, the monitoring logic operable to assert an idle indicator when all transaction requests initiated by the CPU have been completed;
    an idle indicator signal from the monitoring logic coupled to the CPU;
    a memory mapped fence register coupled to the monitoring logic and to the CPU, wherein the fence register has an idle bit that is set in response to the monitoring logic idle indicator; and
    wherein the CPU includes a software program loop buffer, and wherein a program loop executed from the software program loop buffer that polls the idle bit in the fence register does not initiate transaction requests to the one or more memory resources.

10. The system of claim 9, wherein one or more memory resources are configured for access by an external requester that is external to the module, wherein the monitoring logic monitors only transactions initiated by the CPU.

11. The system of claim 10, wherein the monitoring logic is configured to also monitor transactions initiated by an external requester and operable to assert a second idle indicator when all transaction requests initiated by the external requester have been completed.

12. The system of claim 9, wherein the one or more memory resources is a multi-level cache memory.

13. The system of claim 12 wherein:

the one or more memory modules, the monitoring logic and the idle signal indicator are formed within a single integrated circuit; and the system further comprising a plurality of the modules interconnected by a switch fabric.

\* \* \* \* \*